United States Patent
Kurimoto

(10) Patent No.: US 7,086,022 B2
(45) Date of Patent: Aug. 1, 2006

(54) SEMICONDUCTOR INTEGRATED CIRCUIT USING THE SAME

(75) Inventor: Masahiro Kurimoto, Yamanashi-ken (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 356 days.

(21) Appl. No.: 10/246,428

(22) Filed: Sep. 19, 2002

(65) Prior Publication Data

US 2003/0116787 A1 Jun. 26, 2003

(30) Foreign Application Priority Data

Dec. 20, 2001 (JP) .................................... 2001-387165

(51) Int. Cl.
*G06F 9/45* (2006.01)

(52) U.S. Cl. .................................................. 716/6
(58) Field of Classification Search ................ 716/6, 716/4
See application file for complete search history.

(56) References Cited

U.S. PATENT DOCUMENTS

| | | | | |
|---|---|---|---|---|
| 5,872,993 A | * | 2/1999 | Brown | 712/35 |
| 6,173,432 B1 | * | 1/2001 | Harrison | 716/1 |
| 6,353,863 B1 | * | 3/2002 | Nakagawa et al. | 710/5 |
| 6,389,581 B1 | * | 5/2002 | Muddu et al. | 716/6 |
| 6,425,116 B1 | * | 7/2002 | Duboc et al. | 716/18 |
| 6,434,727 B1 | * | 8/2002 | Ishii et al. | 716/6 |
| 6,453,409 B1 | * | 9/2002 | Nakamura | 712/35 |
| 6,487,707 B1 | * | 11/2002 | Kamiya | 716/8 |
| 6,550,045 B1 | * | 4/2003 | Lu et al. | 716/6 |
| 6,643,716 B1 | * | 11/2003 | Hunsaker et al. | 710/21 |
| 6,714,903 B1 | * | 3/2004 | Chu et al. | 703/19 |
| 6,751,786 B1 | * | 6/2004 | Teng et al. | 716/18 |
| 6,839,889 B1 | * | 1/2005 | Liu | 716/18 |

FOREIGN PATENT DOCUMENTS

| | | |
|---|---|---|
| JP | 11-163268 | 6/1999 |
| JP | 2000-003963 | 1/2000 |
| JP | 2000-260949 | 9/2000 |

\* cited by examiner

*Primary Examiner*—Stacy A. Whitmore
(74) *Attorney, Agent, or Firm*—Volentine Francos & Whitt, PLLC

(57) ABSTRACT

A hard macro cell which prevents signal delay and quality deterioration of signal waveforms without requiring excessively long wires, and a semiconductor integrated circuit using the hard macro cell. The semiconductor integrated circuit includes the hard macro cell and other hard macro cells, which are functional blocks for performing predetermined functions. The hard macro cell is provided with input/output terminals for connecting the hard macro cell with the other hard macro cells, a repeater for overcoming signal delay and for improving the quality of signal waveforms, and an input terminal and an output terminal for connecting global wires which connect the other hard macro cells to the repeater. Signals outputted from an output terminal of one of the other hard macro cells are inputted to an input terminal of another of the other hard macro cells via the global wires and the repeater.

12 Claims, 8 Drawing Sheets

SEMICONDUCTOR INTEGRATED CIRCUIT USING THE SAME

BACKGROUND OF THE INVENTION

1. Field of the Invention

The present invention relates to a hard macro cell and a semiconductor integrated circuit using the hard macro cell and, more specifically, to a hard macro cell which is incorporated into a semiconductor integrated circuit as a functional block that is a circuit for performing a predetermined function, such as that of a RAM or a ROM.

2. Description of the Related Art

A semiconductor integrated circuit is generally composed of a plurality of functional blocks. Among these functional blocks, ones having a variety of uses, such as memory blocks, are generally treated as libraries at the functional block level so that they can be used in various applications. Such functional blocks treated as libraries are referred to as hard macro cells. Aside from the hard macro cells, the functional blocks include soft macro cells, in which design content can be modified as is appropriate when the semiconductor integrated circuit is designed. As shown in FIG. 8, the semiconductor integrated circuit is typically formed by combining a plurality of functional blocks including the hard macro cells and the soft macro cells.

In recent years, mainly system LSIs onto which many large-sized hard macro cells are loaded have been used as the semiconductor integrated circuits. The size of the hard macro cells is not uncommonly 5×5 mm or greater, and the size of the LSI is generally 10×10 mm or greater.

Thus, there has been a problem in that global wires for mutually connecting the hard macro cells have been lengthened in proportion to the size of the LSI, which has resulted in increased signal delay between the wires.

Further, because voltage at a power supply for the LSI has been decreased due to advances in fine patterning (reductions in design rules), noise resistance of signals needs to be improved. Not only overcoming the signal delay, but also improving the quality of signal waveforms are important problems.

In order to solve these problems, a repeater (cell) for adjusting the signal delay and the signal waveforms has conventionally been provided at an intermediate portion of the global wires, or the global wires have been passed through the hard macro cell so as to be shortened as much as possible.

FIG. 8 shows a conventional semiconductor integrated circuit 100 that includes functional blocks 101 to 107 for performing predetermined functions. A global wire 108 connecting the hard macro cell 103 (functional block 103) and the hard macro cell 105 (functional block 105) is formed so as to circumvent the hard macro cell 104 (functional block 104), and a repeater 109 is provided at an intermediate portion of the global wire 108.

In such a semiconductor integrated circuit, however, there has been a problem that signal delay and deterioration of signal waveforms cannot be effectively reduced because the global wire is disposed so as to circumvent the hard macro cell 104 and is thereby lengthened excessively. Alternatively, when the global wire is passed through the hard macro cell, there has been a problem that the hard macro cell may cause operational errors because the hard macro cells, such as RAMs or ROMs, which perform analog operations are easily affected by cross-talk with other signal wires and the like.

Japanese Patent Application Laid-Open No. 11-163268 discloses a semiconductor integrated circuit in which a buffer circuit for delay adjustment is provided in a functional block. In this application, however, there is a problem that circuits around the buffer circuit may be affected by cross-talk depending upon the position of the buffer circuit.

SUMMARY OF THE INVENTION

In view of the facts described above, an object of the present invention is to provide a hard macro cell which can prevent signal delay and quality deterioration of signal waveforms without requiring excessively long wires in a semiconductor integrated circuit, and a semiconductor integrated circuit using the hard macro cell.

In order to attain the above-stated object, a first aspect of the present invention is a hard macro cell comprising: a plurality of circuit blocks, the circuit blocks each having a predetermined function; and at least one repeater, which is provided in a predetermined one of the circuit blocks, for adjusting input signals so that the input signals pass through the predetermined circuit block with no significant deterioration of the signals.

The hard macro cell is a functional block which forms at least a portion of a semiconductor integrated circuit such as an LSI, and is a circuit which performs a predetermined function such as that of a CPU, a RAM or a ROM. The hard macro cell includes the plurality of circuit blocks, and each of the circuit blocks has a predetermined function. For example, when the hard macro cell is a RAM, the predetermined function is that of a memory cell array including many memory cells, an address decoder, or the like.

The repeater is provided in a predetermined one of the circuit blocks. The repeater adjusts inputted signals so that the inputted signals pass through the predetermined circuit block with no significant deterioration of the signals. For example, when signals transferred between other hard macro cells pass through the predetermined circuit block, the repeater adjusts the inputted signals so that the signals are not delayed and the waveforms thereof are not distorted. Since the hard macro cell includes the repeater in this manner, wires do not need to circumvent the hard macro cell, whereby the wires can be kept short, and signal delay and distortion of signal waveforms can be prevented.

The predetermined circuit block is less affected by noise from signals passing through the circuit block, and is preferably one for processing digital signals as in a second aspect of the present invention. When signals pass through a circuit block for processing analog signals, the circuit block may be affected by noise from the passing signals. In the present invention, however, since the signals pass through one of the circuit blocks for processing digital signals, the effects of noise can be reduced.

A third aspect of the present invention is the hard macro cell further comprising: peripheral connection terminals; connection terminals provided at the repeater; and internal wires for connecting the connection terminals of the repeater and the peripheral connection terminals. The internal wires are formed in the predetermined circuit block in a similar manner as the repeater. Thus, wires from other hard macro cells are connected to the peripheral connection terminals, whereby the wires between the hard macro cells can be designed such that the wires are prevented from passing through areas of the hard macro cell, which are easily affected by noise. Accordingly, the wires between the hard macro cells can be suitably and easily designed.

Further, since the internal wires pass through the predetermined circuit block, time constants of signal delay, which depend upon disposition of the wires, are fixed. Therefore, the timing of the semiconductor integrated circuit can be easily set.

A fourth aspect of the present invention is the hard macro cell further comprising at least another repeater, with the repeaters being disposed so that orientation directions of the repeaters are different from each other. In other words, the hard macro cell has at least two signal paths in which transmission directions of the signals are different from each other. Accordingly, a greater degree of freedom for design can be achieved.

A fifth aspect of the present invention is the hard macro cell, wherein the internal wires are not preconnected to the connection terminals of the repeater and are selectively connectable to the connection terminals of the repeater. Accordingly, a considerably greater degree of freedom for wire design can be achieved.

A sixth aspect of the present invention is a semiconductor integrated circuit comprising: a plurality of functional blocks performing predetermined functions, the functional blocks being connected to each other; a hard macro cell, which is included in one of the functional blocks and comprising a plurality of areas, which perform predetermined operations; and a repeater formed in one of the areas comprising a digital signal processing section, which adjusts delay and waveforms of signals inputted to the hard macro cell and outputs the adjusted signals to at least one of said functional blocks other than the hard macro cell.

In accordance with the present invention, since the repeater is provided within the hard macro cell, wires do not need to circumvent the hard macro cell, whereby the wires can be kept short, and signal delay and distortion of signal waveforms can be prevented. Further, since the repeater is provided in the one of the areas for processing digital signals, the effects of noise can be reduced.

A seventh aspect of the present invention is the semiconductor integrated circuit, wherein the hard macro cell is one of a RAM and a ROM having memory cells for storing data, and the digital signals processing section selects at least one memory cell corresponding to an address specifying the memory cell.

An eighth aspect of the present invention is the semiconductor integrated circuit, wherein each of the functional blocks has input/output terminals for inputting signals to the functional block and outputting signals from the functional block, with the functional blocks electrically connected to each other via external wires connecting the input/output terminals of functional blocks.

A ninth aspect of the present invention is the semiconductor integrated circuit, wherein the repeater includes connection terminals for transmitting the signals inputted to the hard macro cell and for transmitting the adjusted signals, and the hard macro cell includes internal wires for electrically connecting each connection terminal to an input/output terminal.

The internal wires are formed in the one of the areas for processing digital signals in a similar manner as the repeater. Thus, wires from other hard macro cells are connected to, for example, the input/output terminals provided at the periphery of the hard macro cell, whereby the wires between the hard macro cells can be designed such that the wires are prevented from passing through areas of the hard macro cell, which are easily affected by noise. Accordingly, the wires between the hard macro cells can be suitably and easily designed.

A tenth aspect of the present invention is the semiconductor integrated circuit, wherein the hard macro cell includes at least one input/output terminal which is not electrically connected with any of the connection terminals. In other words, the connection terminals of the repeater and the input/output terminals are not electrically connected to each other in advance. Accordingly, a considerably greater degree of freedom for wire design can be achieved.

DESCRIPTION OF THE PREFERRED EMBODIMENTS

First Embodiment

Figure 1:
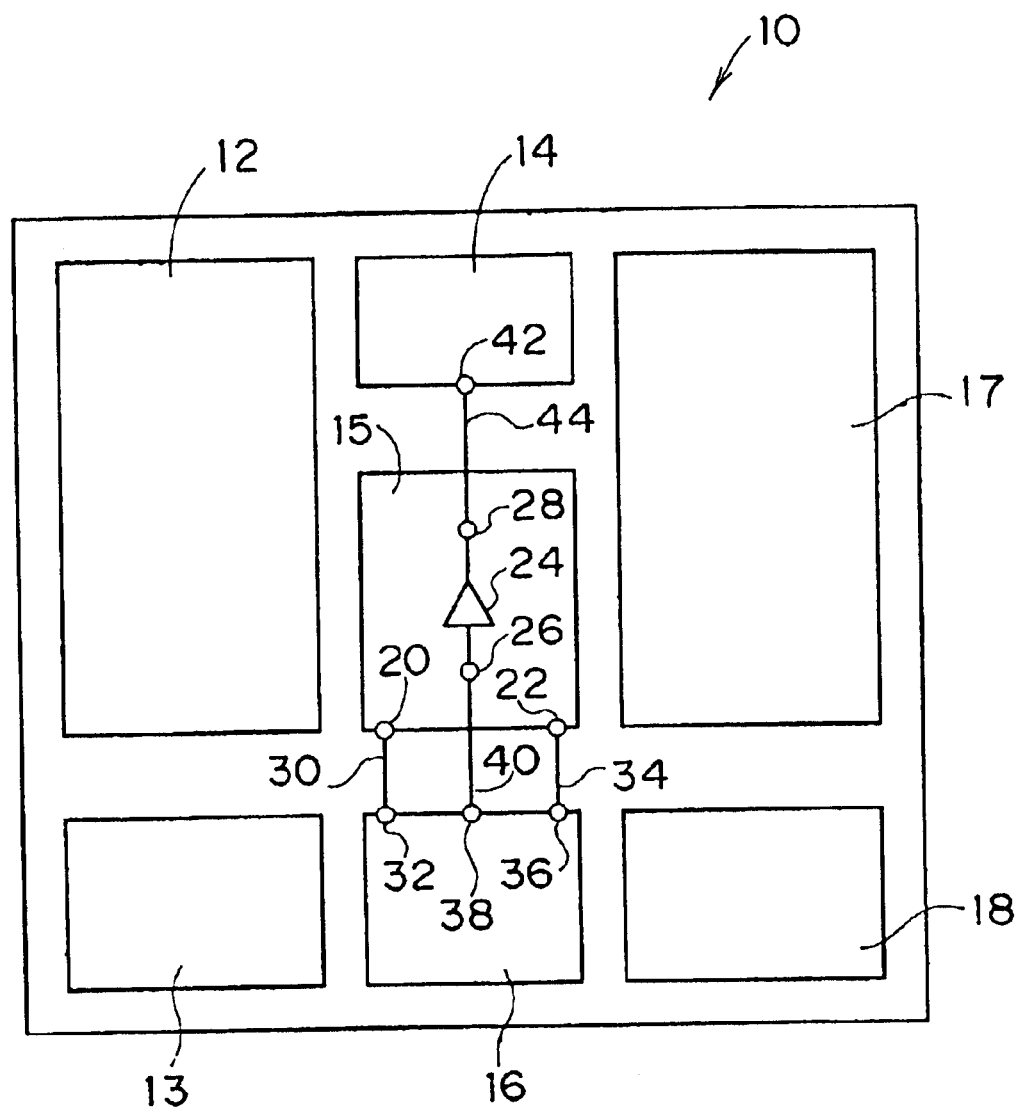
FIG. 1 is a plan view of a semiconductor integrated circuit.

A first embodiment of the present invention will now be explained referring to the drawings. FIG. 1 is a schematic plan view of a semiconductor integrated circuit 10 according to the present invention.

As shown in FIG. 1, the semiconductor integrated circuit 10 includes hard macro cells 12 to 18. The hard macro cells 12 to 18 are functional blocks (circuits) for performing predetermined functions such as those of a CPU, a RAM, a ROM and the like. In this embodiment, a case in which the hard macro cell 15 is an SRAM will be described.

Figure 2:
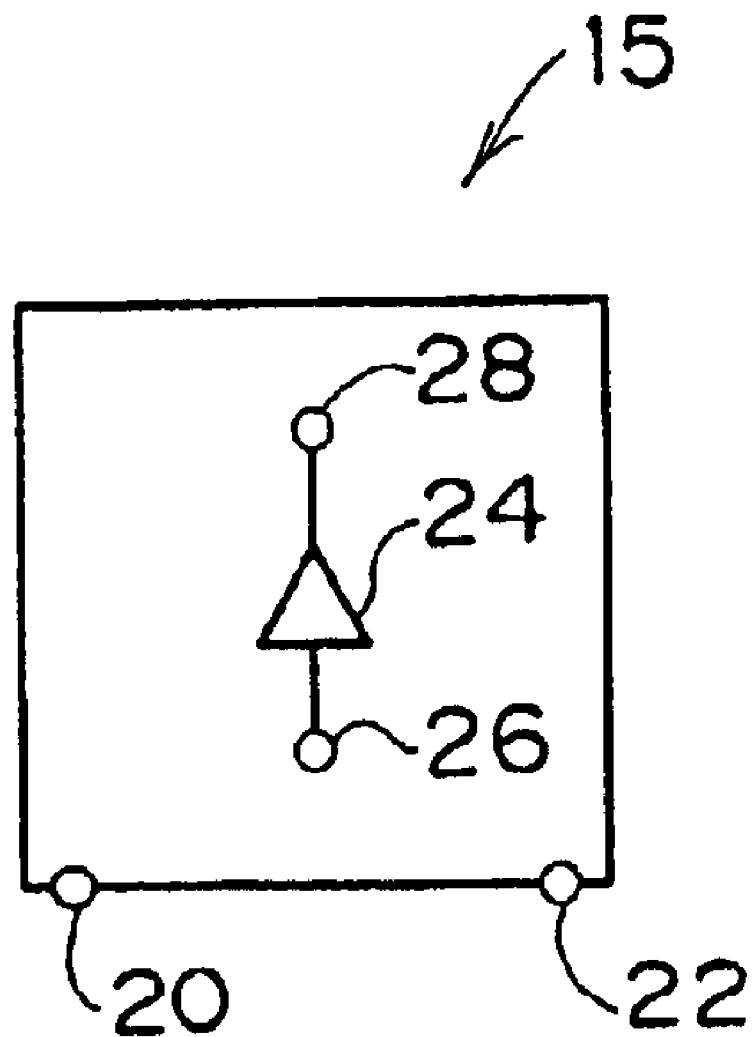
FIG. 2 is a plan view of a hard macro cell according to a first embodiment.

As shown in FIG. 2, the hard macro cell 15 is provided with input/output terminals (peripheral connection terminals) 20 and 22 for connecting the hard macro cell 15 with the other hard macro cells, a repeater (repeater cell) 24 for overcoming signal delay and for improving the quality of signal waveforms, and an input terminal 26 and an output terminal 28 for connecting the repeater 24 to global wires which mutually connect the hard macro cells (and which will be described later). The repeater 24 includes a transistor.

As shown in FIG. 1, the input/output terminal 20 of the hard macro cell 15 is connected with an input/output terminal 32 of the hard macro cell 16 via a global wire 30. The input/output terminal 22 of the hard macro cell 15 is connected with an input/output terminal 36 of the hard macro cell 16 via a global wire 34. As a result, signals can be transferred between the hard macro cells 15 and 16.

An output terminal 38 of the hard macro cell 16 is connected to the input terminal 26 of the repeater 24 via a global wire 40, and an input terminal 42 of the hard macro cell 14 is connected to the output terminal 28 of the repeater 24 via a global wire 44. Accordingly, signals outputted from the output terminal 38 of the hard macro cell 16 are inputted to the input terminal 42 of the hard macro cell 14 via the repeater 24.

Since the repeater 24 is provided in the hard macro cell 15, which is disposed between the hard macro cell 14 and the hard macro cell 16, in this manner, the input terminal 42 of the hard macro cell 14 and the output terminal 38 of the hard macro cell 16 can be connected over a substantially shortest distance between the input terminal 42 and the output terminal 38, and lengths of the global wires can be thereby minimized. Therefore, as compared with a conventional case in which a wire is formed between the hard macro cells 14 and 16 so as to circumvent the hard macro cell 15, signal delay and quality deterioration of the signal waveforms can be effectively prevented. Further, since an area for the repeater 24 does not need to be set aside in areas outside of the hard macro cells, a greater degree of freedom for wire design is possible, and enlargement of the semiconductor integrated circuit 10 can be prevented.

Figure 3:
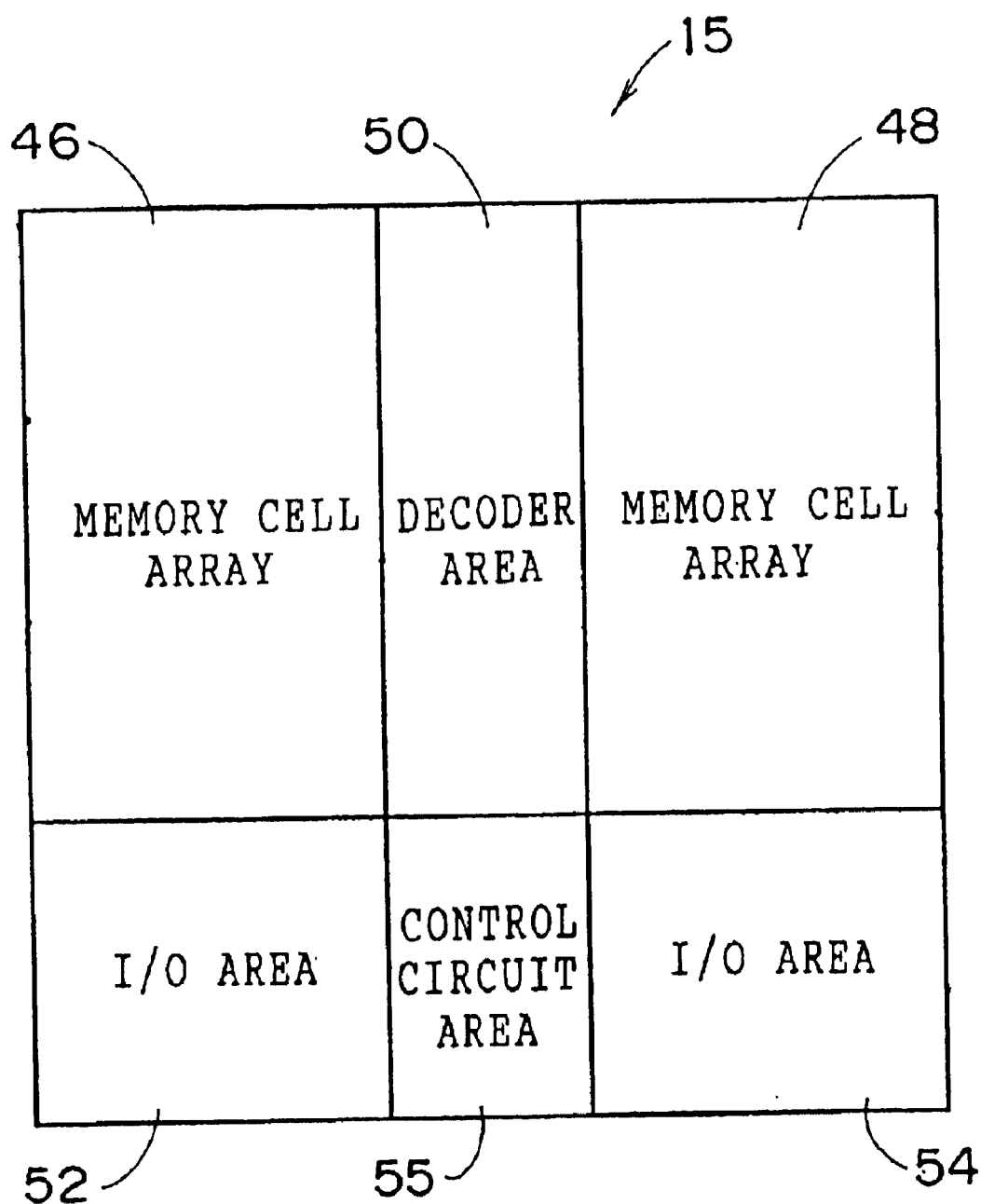
FIG. 3 is a block diagram of the hard macro cell according to the first embodiment.

FIG. 3 shows an example circuit layout of the hard macro cell 15 in which the hard macro cell 15 is divided into a plurality of circuit blocks (areas) with each having a predetermined function. The plurality of circuit blocks include memory cell arrays 46 and 48 in which many memory cells for storing information are disposed, a decoder area 50 in which an address decoder and an address driver for selecting memory cells corresponding to specified addresses from the many memory cells are disposed, I/O areas 52 and 54 in which sense amplifiers for detecting and amplifying signals from the memory cells and I/O buffers are disposed, and a control circuit area 55 in which a control circuit for controlling the decoder area 50 and the I/O areas 52 and 54 is disposed.

Out of these, the memory cell arrays 46 and 48, and the I/O areas 52 and 54 include many memory cells and sense amplifiers, respectively, which handle signals for analog operations depending on minute potential differences, whereby these areas are easily affected by cross-talk with other signal wires.

Therefore, it is preferable that the repeater 24 is not disposed in the memory cell arrays 46 and 48 or in the I/O areas 52 and 54, and that the global wires 40 and 44 are not disposed so as to pass through these areas.

Accordingly, it is preferable that the repeater 24 is disposed in an area which is at less risk of being affected by cross-talk, such as the area including the address decoder and the address driver which perform full-swing operations (i.e., digital operations) or another area in the hard macro cell disposed with power supply wire. In this embodiment, the decoder area 50 or the control circuit area 55 is a suitable location for the repeater 24, and a case in which the repeater 24 is disposed in the control circuit area 55 will be described as an example. In this manner, when the repeater 24 and the global wires 40 and 44 are disposed in one of the areas which are not easily affected by cross-talk, the effects of cross-talk with other signal wires can be effectively prevented.

Figure 4:
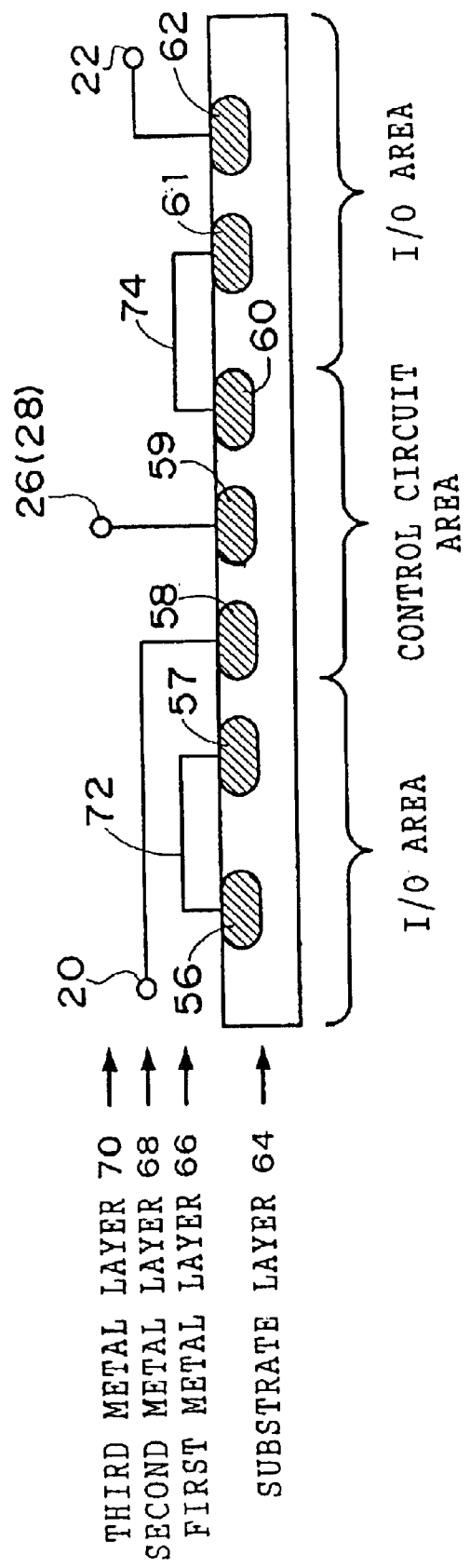
FIG. 4 is a schematic cross-sectional view of the hard macro cell according to the first embodiment.

FIG. 4 is a schematic cross-sectional view of the hard macro cell 15. The hard macro cell 15 comprises a substrate layer 64, which includes elements 56 to 62 such as transistors, having successively disposed thereon a first metal layer 66, a second metal layer 68 and a third metal layer 70 for wiring between the elements and between the elements and the input/output terminals.

The elements 56 and 57 are transistors which form a circuit disposed in the I/O area 52. The elements 58 to 60 are transistors which form a circuit disposed in the control circuit area 55, and the element 59 is a transistor which forms the repeater 24. The elements 61 and 62 are transistors which form a circuit disposed in the I/O area 54.

The element 59 forming the repeater 24 is connected with the input terminal 26 and the output terminal 28 which are disposed in the third metal layer 70. The element 58 is connected with the input/output terminal 20 disposed in the second metal layer 68, and the element 62 is connected with the input/output terminal 22 disposed in the second metal layer 68.

The elements 56 and 57 are connected via a wire 72 formed in the first metal layer 66, and the elements 60 and 61 are connected via a wire 74 formed in the first metal layer 66. The wires between the elements and between the elements and the input/output terminals are thus formed in the plural metal layers (wire layers).

Thus, the global wires 30 and 34 are formed in the second metal layer 68, and the global wires 40 and 44 are formed in the third metal layer 70.

The element 59 forming the repeater 24 is disposed in an unoccupied space or a space reserved for the repeater 24 in the control circuit. As shown in FIG. 4, when the wires of the hard macro cell 15 are formed in the first metal layer 66 and the second metal layer 68, the input terminal 26 and the output terminal 28 are disposed in the third metal layer 70, and the global wires 40 and 44 are formed in the third metal layer 70. In this case, areas which may be disposed with wires and areas which may not be disposed with wires are predetermined so that the global wires 40 and 44 do not pass through the areas which are easily affected by noise when the wires between the hard macro cells are designed.

Thus, the repeater 24 is disposed in one of the areas which are not affected by cross-talk with other signal wires, whereby signal delay and quality deterioration of the signal waveforms can be effectively prevented.

Second Embodiment

Next, a second embodiment of the present invention will be explained. In the second embodiment, a modified example of the hard macro cell 15 of the first embodiment will be described. Components identical to those of the first embodiment will be referred to using the same reference numerals, and detailed description thereof will be omitted.

Figure 5:
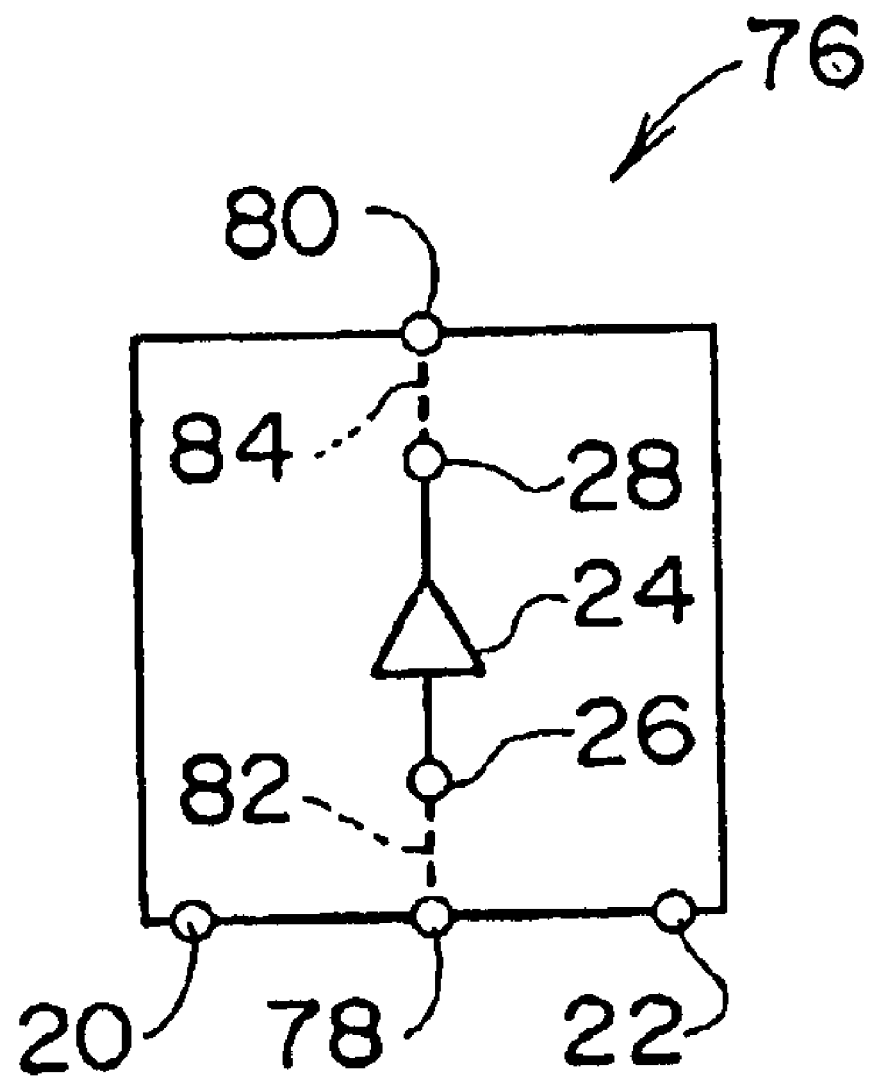
FIG. 5 is a plan view of a hard macro cell according to a second embodiment.

FIG. 5 shows a hard macro cell 76 according to this embodiment, wherein an input terminal 78 is provided at a periphery of the hard macro cell 76 on a lower side of the repeater 24 in FIG. 5, and an output terminal 80 is provided at the periphery of the hard macro cell 76 on an upper side of the repeater 24 in FIG. 5 (hereinafter, the adjectives upper, lower, left and right refer to the orientation in the drawings of elements referred to thereby).

The input terminal 78 provided at the periphery of the hard macro cell 76 and the input terminal 26 of the repeater 24 are connected via an intramacro passing wire (internal wire) 82. The output terminal 80 provided at the periphery of the hard macro cell 76 and the output terminal 28 of the repeater 24 are connected via an intramacro passing wire (internal wire) 84. The global wire 40 is connected to the input terminal 78, and the global wire 44 is connected to the output terminal 80.

When the input terminal 26 and the output terminal 28 of the repeater 24 are disposed in the third metal layer 70, the intramacro passing wires 82 and 84 are formed in the third metal layer 70. However, when the input terminal 26 and the output terminal 28 are disposed in the second metal layer 68, the intramacro passing wires 82 and 84 may be formed in the second metal layer 68. Further, the intramacro passing wires 82 and 84 are formed in the control circuit area 55 or the decoder area 50 which are less affected by cross-talk with other signal wires.

Thus, the input terminal 78 and the output terminal 80 are provided at the periphery of the hard macro cell 76, whereby the wires between the hard macro cells can be designed such that the global wires 40 and 44 are prevented from passing through areas of the hard macro cell, which are easily affected by noise. Accordingly, the wires between the hard macro cells can be suitably and easily designed. Further, since the intramacro passing wires 82 and 84 are formed in the control circuit area 55 or the decoder area 50, which are less affected by cross-talk with other signal wires, the effects of noise on the intramacro passing wires 82 and 84 do not need to be considered.

If the global wires 40 and 44 are formed inside the hard macro cell, time constants, which depend upon resistance components and capacitance components of the wires, will vary with the positions of the global wires 40 and 44, whereby variation in signal delay will occur, making setting of signal timing difficult. In this embodiment, however, the intramacro passing wires 82 and 84 pass through predetermined positions, whereby the time constants of signal delay, which depend upon dispositions of the wires, are fixed. Therefore, the timing of the semiconductor integrated circuit can be easily set.

Third Embodiment

Next, a third embodiment of the present invention will be explained. In the third embodiment, a modified example of the hard macro cell 76 of the second embodiment will be described. Components identical to those of the second embodiment will be referred to using the same reference numerals, and detailed description thereof will be omitted.

Figure 6:
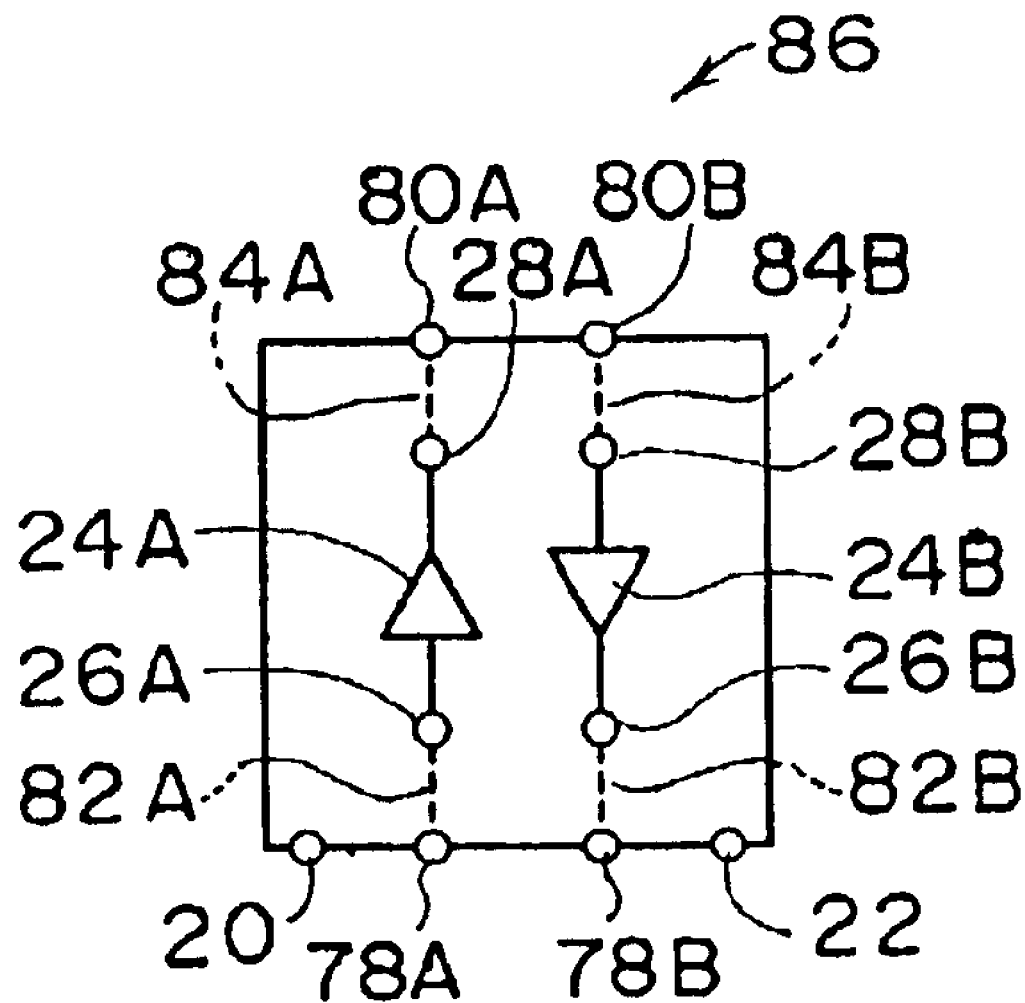
FIG. 6 is a plan view of a hard macro cell according to a third embodiment.

FIG. 6 shows a hard macro cell 86 according to this embodiment, which is provided with a plurality of repeaters 24A and 24B. An input terminal 26A of the repeater 24A is connected with an input terminal 78A, disposed at a periphery of the hard macro cell 86 on a lower side thereof in FIG. 6, via an intramacro passing wire 82A, and an output terminal 28A of the repeater 24A is connected with an output terminal 80A, disposed at the periphery of the hard macro cell 86 on an upper side thereof in FIG. 6, via an intramacro passing wire 84A.

An output terminal 26B of the repeater 24B is connected with an output terminal 78B, disposed at the periphery of the hard macro cell 86 on the lower side thereof in FIG. 6, via an intramacro passing wire 82B, and an input terminal 28B of the repeater 24B is connected with an input terminal 80B, disposed at the periphery of the hard macro cell 86 on the upper side thereof in FIG. 6, via an intramacro passing wire 84B.

As a result, signals from a hard macro cell disposed on the lower side of the hard macro cell 86 in FIG. 6 can be transmitted to a hard macro cell disposed on the upper side of the hard macro cell 86 in FIG. 6 through the hard macro cell 86, and signals from the hard macro cell disposed on the upper side of the hard macro cell 86 in FIG. 6 can be transmitted to the hard macro cell disposed on the lower side of the hard macro cell 86 in FIG. 6 through the hard macro cell 86.

The hard macro cell 86 thus has two signal paths in which transmission directions of the signals are different from each other, whereby a greater degree of freedom for design can be achieved.

Fourth Embodiment

Next, a fourth embodiment of the present invention will be explained. In the fourth embodiment, a modified example of the hard macro cell 86 of the third embodiment will be described. Components identical to those of the third embodiment will be referred to using the same reference numerals, and detailed description thereof will be omitted.

Figure 7:
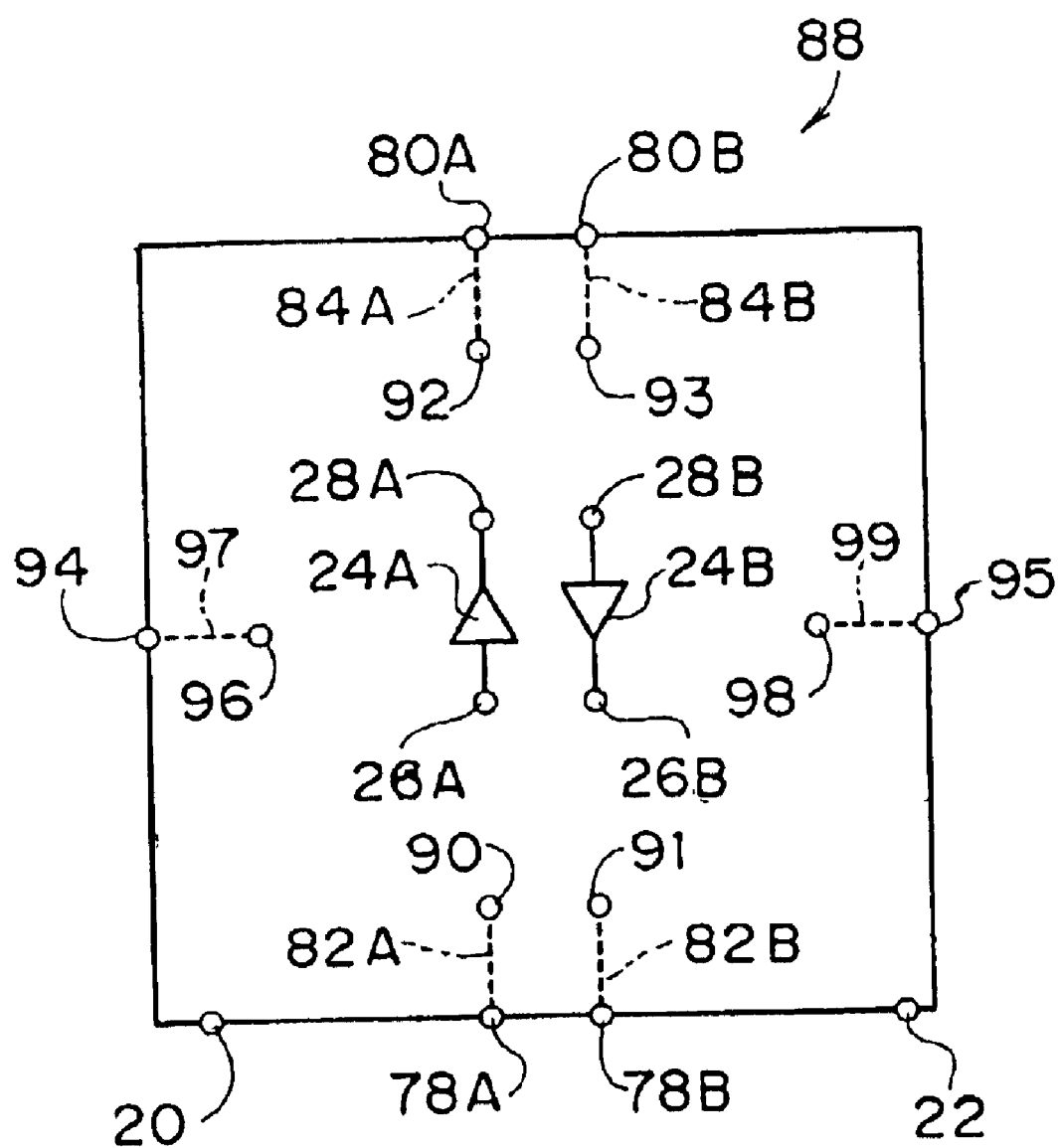
FIG. 7 is a plan view of a hard macro cell according to a fourth embodiment.
Figure 8:
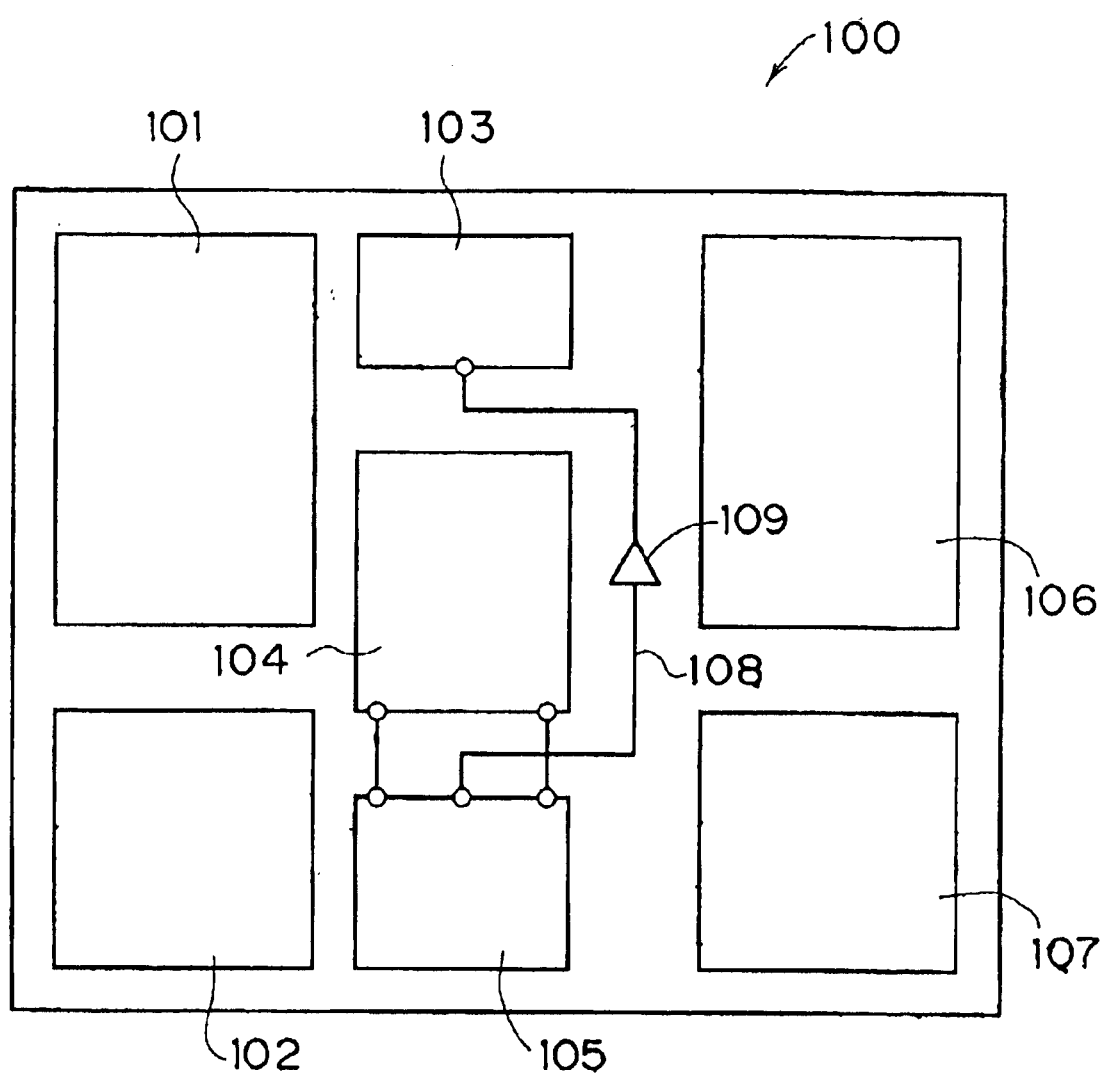
FIG. 8 is a plan view of a conventional semiconductor integrated circuit.

FIG. 7 shows a hard macro cell 88 according to this embodiment, in which the repeater 24A is separated from (not preconnected to) the intramacro passing wires 82A and 84A, and the repeater 24B is separated from (not preconnected to) the intramacro passing wires 82B and 84B. Connection terminals 90 to 93 are connected to one ends of the intramacro passing wires 82A, 82B, 84A and 84B, respectively.

Connection terminals 94 and 95 are provided at a periphery of the hard macro cell 88 on other sides of the hard macro cell 88 than those disposed with the input terminals 78A and 80B and the output terminals 78B and 80A. The connection terminal 94 is connected with a connection terminal 96 via an intramacro passing wire 97, and the connection terminal 95 is connected with a connection terminal 98 via an intramacro passing wire 99. In other words, the terminals for connecting with the global wires are provided on all of the sides of the hard macro cell 88.

Thus, the hard macro cell 88 has a structure in which the repeaters 24A and 24B are separated from the intramacro passing wires, and the terminals for connecting with the global wires are provided on all of the sides of the hard macro cell 88, whereby a considerably greater degree of freedom for wire design can be achieved. For example, when a wire is formed from a hard macro cell disposed on a left side of the hard macro cell 88 in FIG. 7 to a hard macro cell disposed on an upper side of the hard macro cell 88 in FIG. 7, the wire from the hard macro cell disposed on the left side of the hard macro cell 88 is connected to the connection terminal 94, and the connection terminal 96 is connected to the input terminal 26A. Then, the output terminal 28A is connected to the connection terminal 92. In this manner, wires can be flexibly formed in accordance with the positions of the hard macro cells.

When there is no need to overcome signal delay by using the repeaters, the connection terminals may be connected to each other via the wires. Although the two repeaters are provided in this embodiment, three or more repeaters may be used. Further, an increased number of connection terminals may be provided at the periphery of the hard macro cell.

What is claimed is:

1. A semiconductor integrated circuit comprising:
   a plurality of functional blocks that are interconnected and carry out corresponding functions,
   wherein at least one of the functional blocks is a hard macro cell, the hard macro cell comprising
   a plurality of first input terminals to which first signals are input thereto,
   a second input terminal to which a second signal is input thereto,
   a plurality of circuit blocks that carry out the corresponding functions of the hard macro cell responsive to the first signals, to provide third signals,
   a repeater that repeats the second signal to provide a repeater signal having adjusted signal delay and improved signal quality,
   a plurality of first output terminals that provide the third signals as output signals of the hard macro cell, and
   a second output terminal that directly provides the repeater signal as an output of the hard marco cell.

2. The semiconductor integrated circuit of claim 1, wherein the plurality of circuit blocks comprise:
   memory cells that store data; and
   a digital processing section that selects at least one of the memory cells responsive to the first signals.

3. The semiconductor integrated circuit of claim 1, wherein the hard macro cell further comprises:
   a third input terminal to which a third signal is input;
   a second repeater that repeats the third signal to provide a second repeater signal having adjusted signal delay and improved signal quality; and
   a third output terminal that directly provides the second repeater signal as a second output signal of the hard macro cell, wherein the repeater and the second repeater are arranged within the hard macro cell to respectively provide signal flow of the repeater signal and the second repeater signal in opposite directions with respect to each other.

4. The semiconductor integrated circuit of claim 3, wherein the hard macro cell further comprises additional second and third input terminals connectable to provide additional input signals to the repeater and the second repeater.

5. A hard macro including plural metallic layers laminated over a substrate layer, the hard macro cell comprising:
   first and second memory array regions including plural memory cells that store information;
   a decoder region provided between the first and second memory array regions, and including an address decoder and an address driver that select a memory cell corresponding to a designated address from among the plural memory cells;
   a first I/O region provided adjacent the first memory array, and in which a first I/O buffer is disposed;
   a second I/O region provided adjacent the second memory array, and in which a second I/O buffer is disposed;
   a control circuit region disposed between the first and second I/O regions and adjacent the decoder region, and in which a control circuit is disposed, the control circuit controls the memory cells, the address decoder, the address driver, and the I/O buffers;
   a wiring formed of an uppermost layer of the plural metallic layers and within the control circuit region; and
   a repeater disposed at the substrate layer within the control circuit region, the repeater adjusts delay and waveform of signals transmitted along the wiring.

6. The hard macro of claim 5, wherein the wiring is a global wiring connected to other hard macros.

7. The hard macro of claim 5, wherein a peripheral connection terminal is provided at a periphery of the hard macro, and the wiring is internal wiring of the macro cell for connection to a connection terminal of the repeater and the peripheral connection terminal.

8. The hard macro of claim 5, comprising plural repeaters, each repeater is positioned such that a direction of signal transmission of each of the repeaters is different.

9. The hard macro of claim 7, wherein the internal wiring and the connection terminal of the repeater are not preconnected.

10. The hard macro of claim 5, wherein the hard macro is a RAM or a ROM.

11. A semiconductor integrated circuit including multi-level plural metallic layers over a substrate layer, the semiconductor integrated circuit comprising:
   memory array regions including plural memory cells that store information;
   a decoder region including an address decoder and an address driver that select a memory cell corresponding to a designated address from among the plural memory cells;
   I/O regions provided adjacent the memory array regions, and in which I/O buffers are disposed;
   a CPU region disposed adjacent the I/O regions and the decoder region, and in which a CPU is disposed, the CPU controls the memory cells, the address decoder, the address driver, and the I/O buffers;
   a wiring formed of an uppermost layer of the plural metallic layers and within the CPU region; and
   a repeater disposed at the substrate layer within the CPU region, the repeater adjusts delay and waveform of signals transmitted along the wiring.

12. The semiconductor integrated circuit of claim 11, wherein the memory cells are RAM or ROM.

* * * * *